(12) United States Patent
Zhang et al.

(10) Patent No.: US 8,692,593 B1
(45) Date of Patent: Apr. 8, 2014

(54) ZERO OR ULTRA-LOW DC CURRENT CONSUMPTION POWER-ON AND BROWN-OUT DETECTOR

(75) Inventors: Junmou Zhang, Chandler, AZ (US); Jian Qing, Shanghai (CN)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 13/619,418

(22) Filed: Sep. 14, 2012

(51) Int. Cl.
*H03L 7/00* (2006.01)

(52) U.S. Cl.
USPC .............................. 327/143; 327/142; 327/198

(58) Field of Classification Search
USPC .......................................... 327/142, 143, 198
See application file for complete search history.

(56) References Cited

U.S. PATENT DOCUMENTS 6,320,439 B1 * 11/2001 Garbelli et al. ................ 327/198
2008/0150593 A1    6/2008 Chen

OTHER PUBLICATIONS

Dr. Howard Johnson, "Power-On-Reset"; First publication in EDN Magazine, Dec. 1998, 2 pages.

* cited by examiner

*Primary Examiner* — John Poos (57) ABSTRACT

Embodiments of a power-on and brown-out detector are described. In an embodiment, a power-on and brown-out detector for a power supply includes a power-on detection module, a brown-out detection module, and a logic module. The power-on detection module is connected to the power supply and is configured to generate a power-on signal in response to a voltage increase of the power supply. The brown-out detection module is connected to the power supply and is configured to generate a brown-out signal in response to a voltage charge by the power supply and a subsequent voltage decrease of the power supply. The logic module is configured to generate a control signal in response to the power-on signal and the brown-out signal. The power-on detection module is further configured to be activated or deactivated by the control signal. Other embodiments are also described.

19 Claims, 4 Drawing Sheets

ZERO OR ULTRA-LOW DC CURRENT CONSUMPTION POWER-ON AND BROWN-OUT DETECTOR

A semiconductor circuit typically has a built-in power-on detector that detects whether or not the power supply of the semiconductor circuit is present and crosses a certain power-on threshold voltage. The power-on detector circuit can generate a system reset when the voltage of the power supply is too low for the rest of the semiconductor circuit to function normally and release the reset when the voltage of the power supply is high enough for the rest of the semiconductor circuit to function normally. A power-on detector is essential for all semiconductor circuits, and in particular, for digital circuits. For example, without the reset generated by the power-on detector, flip-flops of a digital circuit will be powered up in an undetermined state, which can be either "1" or "0." With the reset generated by the power-on detector, the digital circuit can be powered up into a pre-defined initial state so that operation can be properly started.

In addition to the power-on detector, a semiconductor circuit usually includes a brown-out detector that detects whether or not the power supply of the semiconductor circuit falls below a brown-out voltage. The term "brown-out" comes from the behavior of light bulbs, which output less light when the electricity voltage dips. The brown-out detector can reset the semiconductor circuit when the voltage of the power supply falls below its functional voltage level, which may be caused by inadequate power regulation, turning on or off system components, etc.

The power-on detector and the brown-out detector of a semiconductor circuit typically are always active, even when the semiconductor circuit is in a low power consumption mode such as a standby or idle mode. The current that the power-on detector and the brown-out detector consume directly contributes to the total standby current of the semiconductor circuit. Therefore, minimizing current consumption by the power-on detector and the brown-out detector of a semiconductor circuit is important for the power management. Reducing the standby power consumption of power-on detectors and brown-out detectors is particularly important for battery powered mobile devices.

Embodiments of a power-on and brown-out detector are described. In an embodiment, a power-on and brown-out detector for a power supply includes a power-on detection module, a brown-out detection module, and a logic module. The power-on detection module is connected to the power supply and is configured to generate a power-on signal in response to a voltage increase of the power supply. The brown-out detection module is connected to the power supply and is configured to generate a brown-out signal in response to a voltage charge by the power supply and a subsequent voltage decrease of the power supply. The logic module is configured to generate a control signal in response to the power-on signal and the brown-out signal. The power-on detection module is configured to be activated or deactivated by the control signal. Other embodiments are also described.

In an embodiment, a power-on and brown-out detector for a power supply includes a power-on detection module, a brown-out detection module, and an RS latch. The power-on detection module includes a first transistor connected to the power supply, a first resistor and a second resistor connected to the first transistor and configured to generate a divided output voltage, and a Schmitt trigger configured to generate a power-on signal in response to the divided output voltage and a power-on voltage threshold. The brown-out detection module includes a diode-connected transistor and a capacitor that are connected in series between the power supply and a voltage terminal that has a fixed voltage, a number of transistors that are connected in series between the power supply and the voltage terminal and configured to generate an inverted output voltage, and a voltage comparator configured to generate a brown-out signal in response to the inverted output voltage and a brown-out voltage threshold. The voltage comparator includes a second transistor connected to the power supply and a resistive voltage divider connected to the second transistor and to the voltage terminal. The RS latch is configured to generate a control signal in response to the power-on signal and the brown-out signal. The first transistor is configured to be turned on or off by the control signal.

In an embodiment, a power-on and brown-out detector for a power supply includes a power-on detection module, a brown-out detection module, and an RS latch. The power-on detection module includes a first transistor connected to the power supply, a first resistor and a second resistor connected to the first transistor and configured to generate a divided output voltage, and a Schmitt trigger configured to generate a power-on signal in response to the divided output voltage and a power-on voltage threshold. The brown-out detection module includes a diode-connected transistor and a capacitor that are connected in series between the power supply and a voltage terminal of a fixed voltage, a number of transistors that are connected in series between the power supply and the voltage terminal and configured to generate an inverted output voltage, and a voltage comparator configured to generate a brown-out signal in response to the inverted output voltage and a brown-out voltage threshold. The voltage comparator includes a second transistor connected to the power supply, a resistive voltage divider connected to the second transistor and to the voltage terminal, and a discharging path formed by a third transistor and a third resistor. The RS latch is configured to generate a control signal in response to the power-on signal and the brown-out signal. The first transistor is configured to be turned on or off by the control signal.

Other aspects and advantages of embodiments of the present invention will become apparent from the following detailed description, taken in conjunction with the accompanying drawings, depicted by way of example of the principles of the invention.

Throughout the description, similar reference numbers may be used to identify similar elements.

It will be readily understood that the components of the embodiments as generally described herein and illustrated in the appended figures could be arranged and designed in a wide variety of different configurations. Thus, the following detailed description of various embodiments, as represented in the figures, is not intended to limit the scope of the present disclosure, but is merely representative of various embodiments. While the various aspects of the embodiments are presented in drawings, the drawings are not necessarily drawn to scale unless specifically indicated.

The described embodiments are to be considered in all respects only as illustrative and not restrictive. The scope of the invention is, therefore, indicated by the appended claims rather than by this detailed description. All changes which come within the meaning and range of equivalency of the claims are to be embraced within their scope.

Reference throughout this specification to features, advantages, or similar language does not imply that all of the features and advantages that may be realized with the present invention should be or are in any single embodiment. Rather, language referring to the features and advantages is understood to mean that a specific feature, advantage, or characteristic described in connection with an embodiment is included in at least one embodiment. Thus, discussions of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize, in light of the description herein, that the invention can be practiced without one or more of the specific features or advantages of a particular embodiment. In other instances, additional features and advantages may be recognized in certain embodiments that may not be present in all embodiments of the invention.

Reference throughout this specification to "one embodiment," "an embodiment," or similar language means that a particular feature, structure, or characteristic described in connection with the indicated embodiment is included in at least one embodiment. Thus, the phrases "in one embodiment," "in an embodiment," and similar language throughout this specification may, but do not necessarily, all refer to the same embodiment.

A Resistor-Capacitor (RC)-based circuit, such as the RC circuit described in Howard Johnson, titled "Power-On-Reset," EDN Magazine December 1998, can be used as a power-on detector. Although the RC-based power-on detector consumes nearly zero static current, the RC-based power-on detector cannot detect brown-out and cannot generate a reset for a slow-rising power supply. In addition, the RC-based power-on detector may erroneously generate a reset in response to a spike in the power supply voltage because the resistor and the capacitor typically respond slowly to power supply changes. Other conventional power-on detectors, such as the feedback-based power-on detector described in Chen (U.S. Pat. App. Pub. No. 2008/0150593), either lack brown-out detection capability or incur significant static current consumption.

Figure 1:
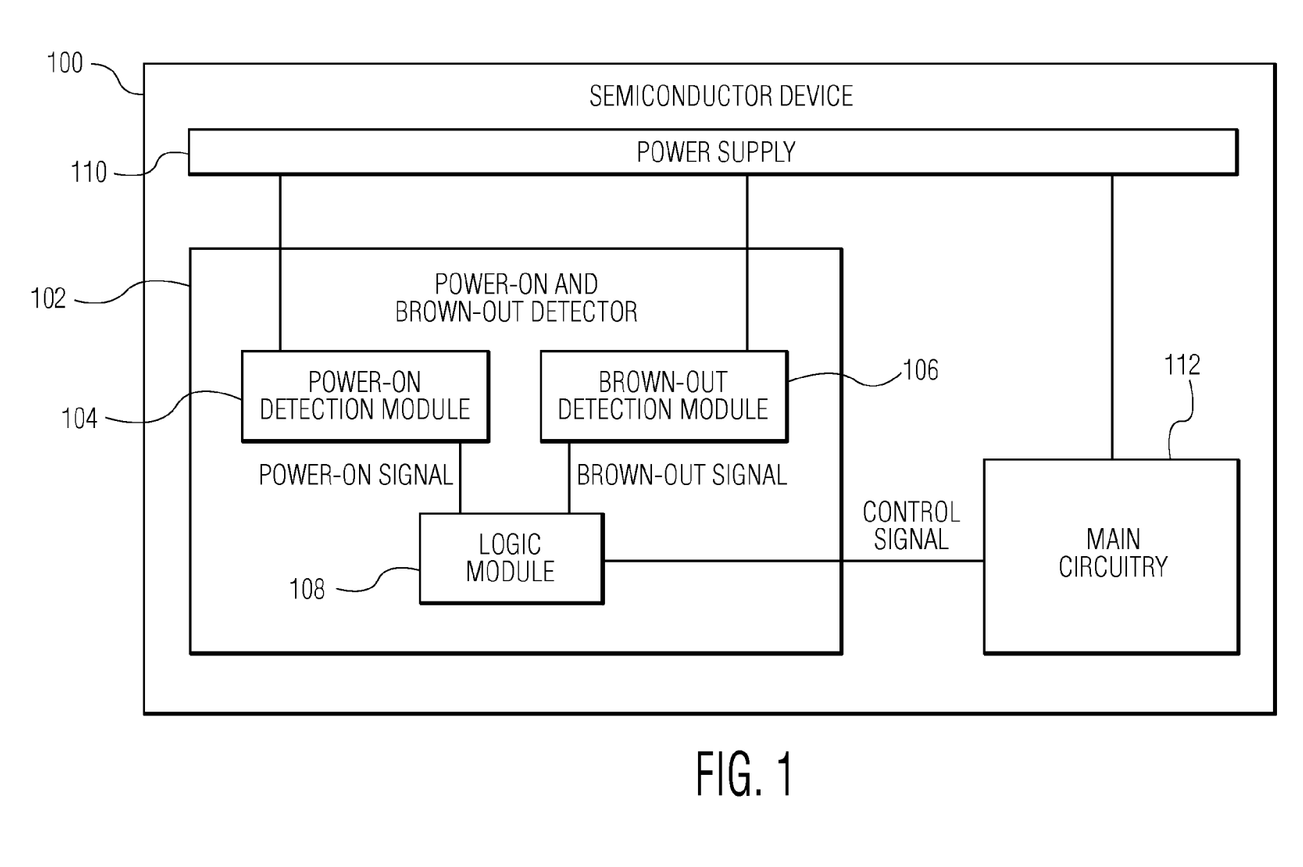
FIG. 1 is a schematic block diagram of a semiconductor device in accordance with an embodiment of the invention.

FIG. 1 is a schematic block diagram of a semiconductor device 100 in accordance with an embodiment of the invention. The semiconductor device may be a semiconductor circuit, such as, a digital circuit. In the embodiment depicted in FIG. 1, the semiconductor device includes a power-on and brown-out detector 102, a power supply 110, and main circuitry 112. The semiconductor device can be implemented in a substrate, such as a semiconductor wafer or a printed circuit board (PCB). In an embodiment, the semiconductor device is packaged in a semiconductor chip and included in a computing device, such as a smartphone, a tablet computer, a laptop, etc.

In the embodiment depicted in FIG. 1, the power-on and brown-out detector 102 includes a power-on detection module 104, a brown-out detection module 106, and a logic module 108. The power-on detection module 104 performs power-on detection of the power supply 110 to generate a power-on signal. The brown-out detection module 106 performs brown-out detection of the power supply to generate a brown-out signal. In an embodiment, the power-on signal and the brown-out signal are digital signals, such as binary signals. The logic module 108 performs at least one logic operation on the power-on signal and the brown-out signal to generate a control signal, which can be used to control the main circuitry 112 of the semiconductor device 100. For example, the control signal generated by the logic module 108 can be used to reset the main circuitry or to indicate that the power of the power supply is adequate for running the main circuitry.

The power supply 110 of the semiconductor device 100 provides power for the power-on and brown-out detector 102 and the main circuitry 112. The power supply may be of any suitable type. In an embodiment, the power supply includes a battery power supply, such as a lithium battery and/or any other type of battery. Although the power supply is shown in FIG. 1 as being an element of the semiconductor device, in other embodiments, the power supply may be located external to the semiconductor device. In an embodiment, the power supply includes a voltage rail or line that is extended into the semiconductor device.

The main circuitry 112 of the semiconductor device 100 includes circuit components that perform one or more functions of the semiconductor device. For example, the main circuitry may include timekeeping circuit components that perform timekeeping functions, such as generating a current time value, storing the current time value and other parameters, and communicating with external entities.

In an embodiment, the power-on detection module 104 is connected to the power supply 110 and is configured to generate the power-on signal in response to a voltage increase of the power supply. The power-on detection module 104 is configured to be activated or deactivated by the feedback (i.e., the control signal) from the logic module 108. Because the power-on detection module 104 is deactivated in response to the feedback from the logic module 108, the current consumption of the power-on detection module 104 is reduced. In this embodiment, the brown-out detection module 106 is also connected to the power supply and is configured to generate the brown-out signal in response to a voltage charge by the power supply and a subsequent voltage decrease of the power supply. Because the brown-out detection module 106 can use the voltage charge of the power supply for the generation of the brown-out signal, the current consumption of the brown-out detection module 106 is reduced.

Figure 2:
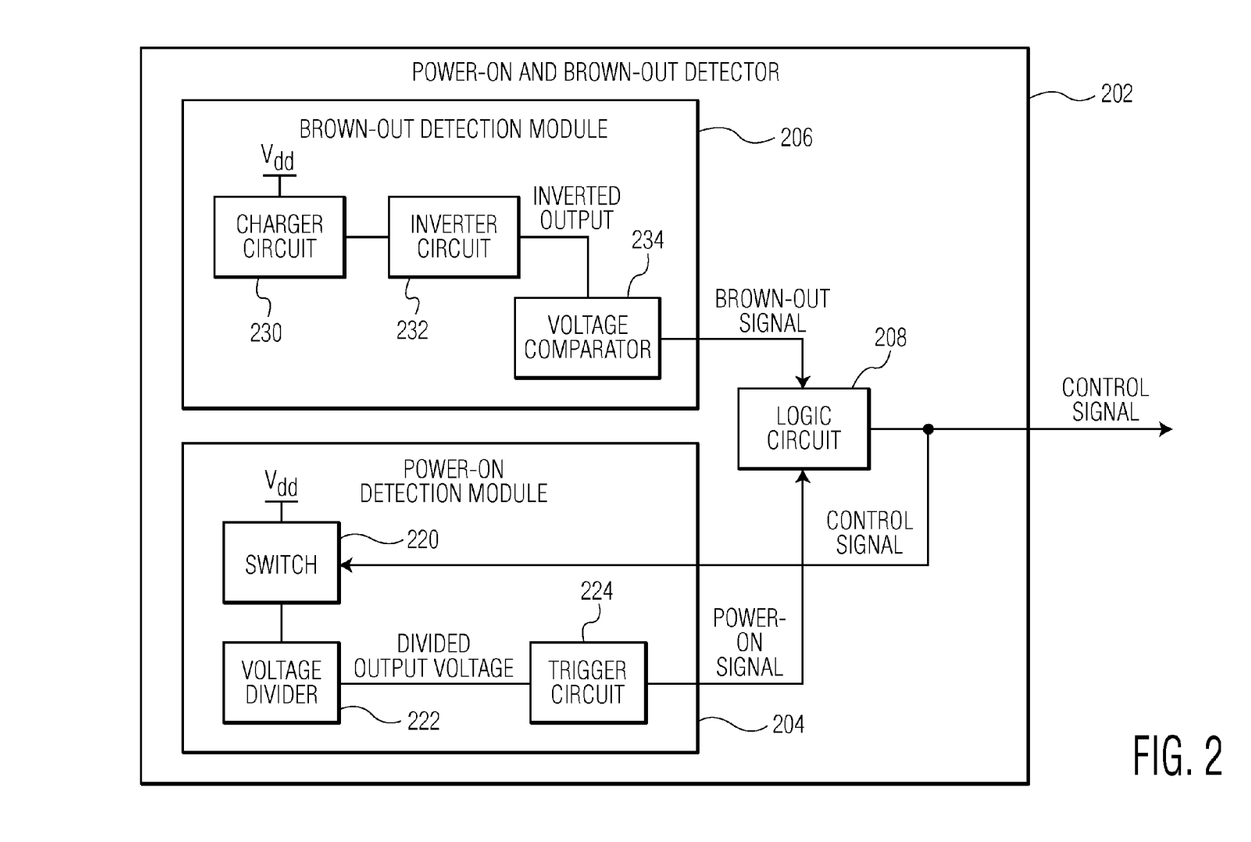
FIG. 2 depicts an embodiment of the power-on and brown-out detector shown in FIG. 1.

FIG. 2 depicts an embodiment of the power-on and brown-out detector 102 depicted in FIG. 1. In the embodiment depicted in FIG. 2, a power-on and brown-out detector 202 includes a power-on detection module 204, a brown-out detection module 206, and a logic module 208. Both the power-on detection module 204 and the brown-out detection module 206 are connected to the power supply 110 (shown in FIG. 1), which has a power supply voltage "$V_{dd}$."

The power-on detection module 204 includes a switch 220, a voltage divider 222, and a trigger circuit 224. The switch 220 is connected to the power supply voltage $V_{dd}$ and is configured to control the power supplied to the voltage divider 222. The voltage divider 222 is connected to the switch 220 and is configured to generate a divided output voltage. For example, the voltage divider 222 can generate a divided output voltage of 50% of the power supply voltage $V_{dd}$. In one embodiment, the voltage divider 222 includes a first resistor that is connected to the switch 220 and to the trigger circuit 224 and a second resistor that is connected to the trigger circuit 224 and to a voltage terminal that is at a fixed voltage, such as ground. In one embodiment, the voltage divider 222 is further configured to generate the divided output voltage if the switch 220 is turned on. The trigger circuit 224, which may be a Schmitt trigger, is configured to generate a power-on signal in response to the divided output voltage. In one embodiment, the trigger circuit 224 is further configured to generate the power-on signal in response to the divided output voltage and a power-on voltage threshold. In this embodiment, the trigger circuit 224 generates the power-on signal at a logical high if the divided output voltage is higher than the power-on voltage threshold.

The brown-out detection module 206 includes a charger circuit 230, an inverter circuit 232, and a voltage comparator 234. The charger circuit 230, which is also referred to as a ramp down detection circuit, is connected to the power supply voltage $V_{dd}$ and is configured to be charged by the power supply 110. In one embodiment, the charger circuit 230 includes a diode-connected transistor and a capacitor that are connected in series between the power supply 110 and a voltage terminal that is at a fixed voltage, such as ground. The inverter circuit 232 is connected to the charger circuit 230 and is configured to generate an inverted output voltage. In one embodiment, the inverter circuit 232 includes a number of transistors that are connected in series between the power supply and a voltage terminal that is at a fixed voltage, such as ground. In one embodiment, at least one of the transistors is a diode-connected transistor. The voltage comparator 234 is configured to generate a brown-out signal in response to the inverted output voltage. In one embodiment, the voltage comparator 234 includes a transistor connected to the power supply and a resistive voltage divider connected to the transistor and to a voltage terminal that is at a fixed voltage, such as ground. In one embodiment, the voltage comparator 234 further includes a discharging path formed by another transistor and a resistor.

The logic module 208 is configured to generate a control signal that can be used to control the main circuitry 112 (shown in FIG. 1), in response to the power-on signal and the brown-out signal. In one embodiment, the logic module 208 includes an RS latch or a JK flip-flop. In the embodiment depicted in FIG. 2, the control signal of the logic module 208 is fed to the power-on detection module 204 to control the switching on/off of the switch 220. In one embodiment, the switch 220 includes a transistor and the control signal is input into a gate terminal of the transistor.

In an example of an operation of the power-on and brown-out detector 202, the control signal from the logic module 208 is at a logical low when the power supply 110 starts up. The switch 220 is turned on by the control signal from the logic module 208 and supplies power to the voltage divider 222, which generates a divided output voltage, which is a percentage of the power supply voltage $V_{dd}$. When the divided output voltage is higher than the trigger voltage of the trigger circuit 224, the trigger circuit 224 generates the power-on signal at a logical high. The logic module 208 generates a reset for the main circuitry 112 in response to a power-on signal at a logical high. Because the switch 220 of the power-on detection module 204 is deactivated in response to the feedback from the logic module 208, the current consumption of the power-on detection module 204 is reduced. After the power supply 110 starts up, the power supply voltage $V_{dd}$ is at a stable voltage level. The charger circuit 230, which may include a diode-connected transistor and a capacitor that are connected in series between the power supply and ground, is charged to a charged voltage by the power supply voltage $V_{dd}$. The power supply voltage $V_{dd}$ subsequently decreases after reaching the stable voltage level. In response to the decrease of the power supply voltage $V_{dd}$, the inverter circuit 232 generates an inverted output voltage, which turns on the voltage comparator 234 to generate a brown-out signal at a logical high. The logic module 208 generates a reset for the main circuitry 112 in response to the brown-out signal at a logical high. Because the brown-out detection module 206 can use the voltage charge of the power supply to the charger circuit 230 for the generation of the brown-out signal, the current consumption of the brown-out detection module 206 is reduced.

Figure 3:
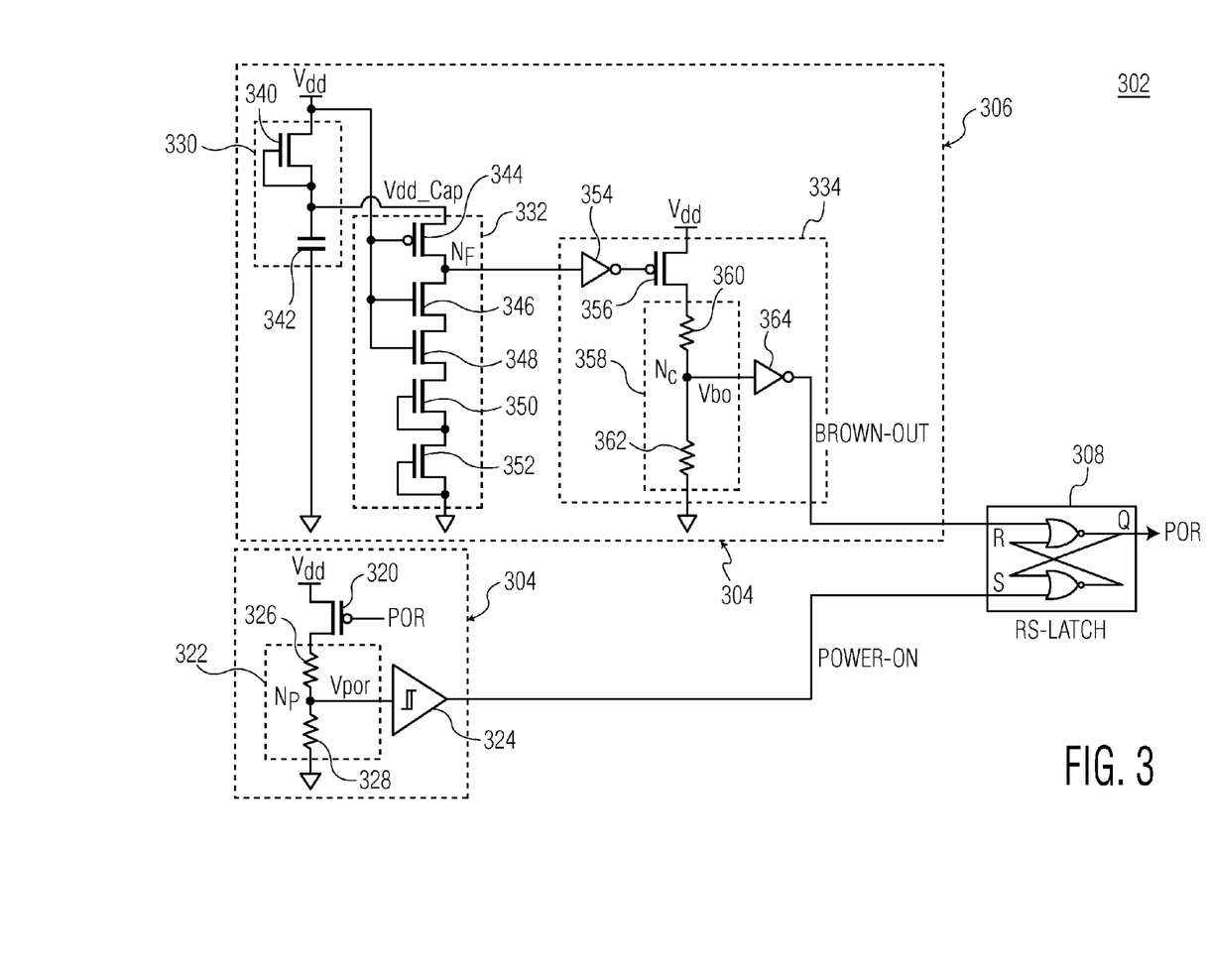
FIG. 3 depicts an embodiment of the power-on and brown-out detector shown in FIG. 2.

FIG. 3 depicts an embodiment of the power-on and brown-out detector 202 depicted in FIG. 2. In the embodiment depicted in FIG. 3, a power-on and brown-out detector 302 includes a power-on detection module 304 configured to generate a power-on signal by monitoring the power supply voltage "$V_{dd}$" of the power supply 110 (shown in FIG. 1), a brown-out detection module 306 configured to generate a brown-out signal by comparing the power supply voltage $V_{dd}$ with a predetermined voltage threshold, and an RS latch 308 configured to generate a power-on reset (POR) signal that can be used to reset the main circuitry 112 (shown in FIG. 1). In some embodiments, the RS latch 308 is replaced with a JK flip-flop.

The power-on detection module 304 includes a PMOS transistor 320, a resistive voltage divider 322 that includes resistors 326, 328, and a Schmitt trigger 324 that is used for noise immunity. In an example of an operation of the power-on detection module 304, the POR signal of the RS latch 308 has an initial voltage of zero. Because the POR signal is fed to the PMOS transistor 320, the POR signal with zero voltage turns on the PMOS transistor 320. After the PMOS transistor 320 is turned on, the output signal of the resistive voltage divider 322, having a voltage "$V_{por}$," is generated at the node "$N_p$" between the resistors 326, 328. The voltage $V_{por}$ at the node $N_p$ is a percentage of the power supply voltage $V_{dd}$. Specifically, the percentage relationship between the output voltage $V_{por}$ of the resistive voltage divider 322 and the power supply voltage $V_{dd}$ is determined by the resistance values of the resistors 326, 328. When the power supply voltage $V_{dd}$ is low, both the power-on signal and the brown-out signal are logical low (zero), and the POR signal of the RS latch keeps the previous state, i.e., zero. With the power supply voltage $V_{dd}$ ramping up, the output voltage $V_{por}$ at the node $N_p$ between the resistors 326, 328 also increases. Once the voltage $V_{por}$ reaches the trip point of the Schmitt trigger 324, the Schmitt trigger 324 will generate a signal of logical high (i.e., logical positive) at the "S" input of the RS latch, which sets the POR signal at logical high. The PMOS transistor 320 is turned off by the POR signal of logical high, which causes the voltage $V_{por}$ at the node $N_p$ between the resistors 326, 328 to decrease. When the voltage $V_{por}$ decreases below the trip point of the Schmitt trigger 324, the Schmitt trigger 324 will generate a signal at logical low (i.e., logical negative) at the "S" input of the RS latch. Since both the power-on signal and the brown-out signal are logical low, the RS latch keeps the previous state, i.e., logical high.

The brown-out detection module 306 includes a charger circuit 330, an inverter circuit 332, and a voltage comparator 334. The charger circuit 330, which is also referred to as a ramp down detection circuit, includes a diode-connected NMOS transistor 340 and a capacitor 342. In some embodiments, the charger circuit 330 includes a diode, instead of the diode-connected NMOS transistor 340. Compared to a diode-connected transistor, a diode has a lower component cost. The inverter circuit 332 includes transistors 344, 346, 348, 350, 352 and uses the power supply voltage $V_{dd}$ as an input. The voltage comparator 334 includes inverters 354, 364, a transistor 356, and a resistive voltage divider 358 that includes resistors 360, 362.

In an example of an operation of the brown-out detection module 306, when the power supply voltage $V_{dd}$ of the power supply 110 reaches a steady state, the capacitor 342 will be charged to a voltage "$V_{dd\_cap}$" that is equal to the stabilized power supply voltage $V_{dd}$ minus $V_{diode}$, where $V_{diode}$ is the voltage drop across the diode-connected NMOS transistor 340. The voltage $V_{dd\_cap}$ serves as a local power supply for the inverter circuit 332 that is formed by the transistors 344-352. After the charger circuit 330 is charged to the voltage $V_{dd\_cap}$, the power supply voltage $V_{dd}$ may fluctuate. When the current power supply voltage $V_{dd}$ is higher than the voltage $V_{dd\_cap}$, the inverter circuit 332 generates a low output at the node "$N_f$" between the inverter circuit 332 and the voltage comparator 334, which is used for falling edge detection. Once the current power supply voltage $V_{dd}$ dips below the voltage $V_{dd\_cap}$ by a threshold voltage, the inverter circuit 332 generates a high output at the node $N_f$, indicating that the power supply voltage $V_{dd}$ has dropped below a predefined level. In particular, the signal at the node $N_f$ turns on the transistor 356 of the voltage comparator 334, which causes the voltage "$V_{bo}$" at the node "$N_c$" between the resistors 360, 362 of the resistive voltage divider 358 to increase. The voltage $V_{bo}$ at the node $N_c$ can be used to determine whether the brown-out trip voltage has been reached or not.

The inverter circuit 332, which is composed of the transistors 344-352, has zero or ultra low leakage current. At the voltage edge where the power supply voltage $V_{dd}$ is dropped to a level that is high enough to turn on the transistor 344, there is leakage current going through the transistors 344-352, which discharges the capacitor 342. Because the voltage $V_{dd\_cap}$ memorizes the previous voltage of the power supply voltage $V_{dd}$, this leakage current can inadvertently lower the voltage level of the previously memorized voltage $V_{dd}$. To minimize the effect of leakage current on the capacitor 342, the capacitor 342 has a relative large capacitance value, and the transistors 340, 344 have long channel length with a lower threshold voltage and a lower leakage. For example, the capacitor 342 with a 3 pF capacitance can support a 10 microseconds (μS) to 1000 power supply ramping down slope, while the capacitor 342 with a 45 pF capacitance is good for 10 seconds ramping down slope for some slower ramping-down scenarios. In an embodiment, a long channel transistor is defined as a transistor with a width to length (W/L) ratio much less than 1 and a current that doesn't depend on the drain-source voltage "$V_{ds}$" of the transistor once the drain-source voltage $V_{ds}$ is larger than the threshold voltage $V_{th}$ of the transistor. The transistors 346, 348 have small W/L ratio, which can create a large resistance for the leakage path. In some embodiments, additional transistors are cascaded with the transistors 346, 348 to create an even larger resistance. The transistors 350, 352 are diode connected to lower the leakage current. Compared to the leakage current of the semiconductor device 100, the leakage current consumption of the power-on and brown-out detector 302 is relatively small. For example, the leakage current of the power-on and brown-out detector 302 can be on the order of picoamperes (pA) while the leakage current of the semiconductor device 100 is on the order of nanoamperes (nA).

In an embodiment, the power-on threshold (reset trip) voltage and the brown-out threshold (reset trip) voltage of the power-on and brown-out detector 302 are temperature dependent. For example, when the operation temperature of the power-on and brown-out detector 302 increases, the power-on reset trip voltage decreases until a temperature threshold is met. After the temperature threshold is met, the power-on reset trip voltage is fixed. In another example, when the operation temperature of the power-on and brown-out detector 302 increases, the brown-out reset trip voltage decreases.

Figure 4:
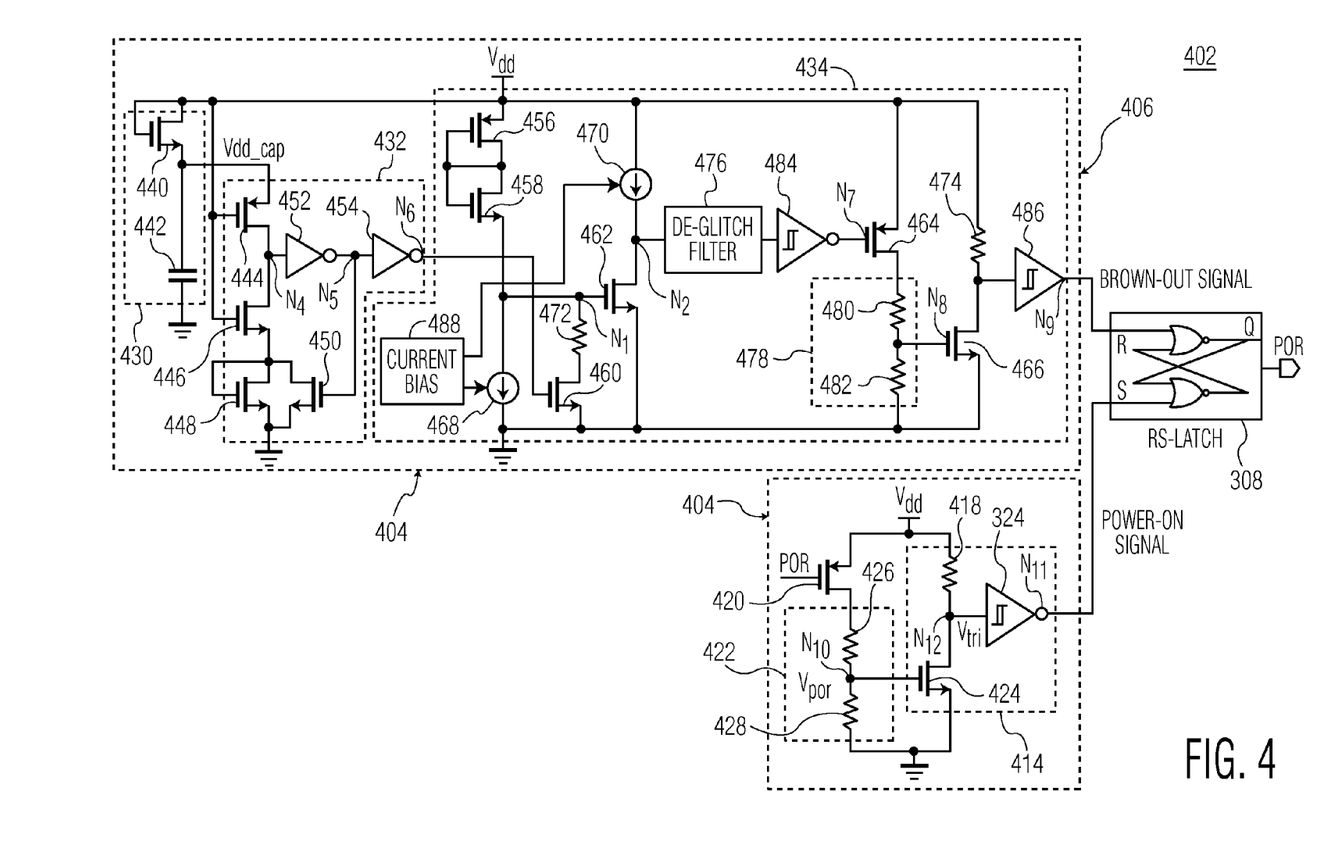
FIG. 4 depicts another embodiment of the power-on and brown-out detector shown in FIG. 2.

FIG. 4 depicts an embodiment of the power-on and brown-out detector 202 depicted in FIG. 2 that detects power supply brown-out independently of power ramp down time. In the embodiment depicted in FIG. 4, a power-on and brown-out detector 402 includes a power-on detection module 404 that functions the same or similarly as the power-on detection module 304, a brown-out detection module 406 that functions the same or similarly as the brown-out detection module 306, and the RS latch 308. Compared to the power-on and brown-out detector 302 depicted in FIG. 3, the power-on and brown-out detector 402 depicted in FIG. 4 consumes an ultra low Direct Current (DC) that is power supply independent.

The power-on detection module 404 includes a PMOS transistor 420, a resistive voltage divider 422 that includes resistors 426, 428, and a trigger circuit 414. The trigger circuit 414 includes a resistor 418, a transistor 424, and a Schmitt trigger 324. In an example of an operation of the power-on detection module 404, the POR signal of the RS latch 308 has an initial voltage of zero. Because the POR signal is fed to the PMOS transistor 420, the POR signal with zero voltage turns on the PMOS transistor 420. After the PMOS transistor 420 is turned on, the output signal of the resistive voltage divider 422 having a voltage "$V_{por}$," which is a percentage of the power supply voltage $V_{dd}$, is generated at the node "$N_{10}$" between the resistors 426, 428. When the power supply voltage $V_{dd}$ is low, both the power-on signal and the brown-out signal are logical low, and the POR signal of the RS latch keeps its previous state, i.e., zero. With the power supply voltage $V_{dd}$ ramping up, the output voltage $V_{por}$ at the node $N_{10}$ between the resistors 426, 428 increases and turns on the transistor 424. Once the voltage "$V_{tri}$" at the node "$N_{12}$" between the resistor 418 and the transistor 424 reaches the trip point of the Schmitt trigger 324, the Schmitt trigger 324 will generate a signal of logical high at the "S" input of the RS latch, which sets the POR signal to logical high. The PMOS transistor 420 is turned off by the POR signal at logical high, which causes the voltage $V_{tri}$ at the node $N_{12}$ to decrease. When the voltage $V_{tri}$ decreases below the trip point of the Schmitt trigger 324, the Schmitt trigger 324 will generate a signal at logical low (i.e., logical negative) at the "S" input of the RS latch at node $N_{11}$. Since both the power-on signal and the brown-out signal are logical low, the RS latch keeps the previous state, i.e., logical high.

The brown-out detection module 406 includes a charger circuit 430, an inverter circuit 432, and a voltage comparator 434. The charger circuit 430, which is also referred to as a ramp down detection circuit, includes a diode-connected NMOS transistor 440 and a capacitor 442. The inverter circuit 432 includes transistors 444, 446, 448, 450 and inverters 452, 454. The voltage comparator 434 includes transistors 456, 458, 460, 462, 464, 466, current sources 468, 470, resistors 472, 474, a de-glitch filter 476, a resistive voltage divider 478 that includes resistors 480, 482, and Schmitt triggers 484, 486. In the embodiment depicted in FIG. 4, the current sources 468, 470 are both connected to a current bias circuit 488, which is located inside the brown-out detection module 406. However, in some embodiments, the current bias circuit 488 may be located external to the brown-out detection module 406, or even located external to the power-on and brown-out detector 402.

In an example of an operation of the brown-out detection module 406, the diode-connected transistors 456, 458 have current bias provided by the current sources 468, 470. The voltages of the diode-connected transistors 456, 458 shift down from $V_{dd}$ to $V_{dd}-2*V_{diode}$, where $V_{diode}$ is the voltage drop across one of the diode-connected transistors 456, 458. The function of the current sources is to control current consumption, which can make the brown-out detection module 406 suitable for a wide power supply range. The current bias provided by the current sources can work at a relatively low voltage and can limit the start up settling time. The brown-out trip point is defined as "$2*V_{diode}+V_{th}$," where $V_{th}$ is the threshold voltage of the transistor 462. When the power supply voltage $V_{dd}$ of the power supply 110 falls, the voltage at node $N_1$, which is at the gate terminal of the transistor 462, falls accordingly. Normally when the power supply voltage $V_{dd}$ is high, the voltage at node $N_2$, which is the intersection point of the current source 470, the de-glitch filter, and the transistor 462, is strongly pulled down to ground since the transistor 462 is turned on. As the voltage at node $N_2$ is pulled down to ground, the transistor 464 is turned off, which cause the voltage at node $N_9$, which is at the output terminal of the Schmitt trigger 486, to be constant high. When the power supply voltage $V_{dd}$ falls below the trip point of the transistor 462, the transistor 462 is turned off and the voltage at the node $N_2$ becomes high. In addition, the voltage at node $N_7$, which is the output terminal of the Schmitt trigger 484, becomes low. The low voltage at the node $N_7$ turns on the transistor 464 and the resistor divider 478, which function with the resistor 474, the transistor 466, and the Schmitt trigger 486 to determine whether the brown-out trip voltage has been reached or not.

The transistor 460 and the damping resistor 472 form an additional discharging path at node $N_1$, which discharges the voltage at node $N_1$ under fast power ramp down of 10 µs or less. The gate control signal of the transistor 460 is generated from the charger circuit 430 that includes the transistor 440 and the capacitor 442 and the inverter circuit 432. In the charger circuit 430, the capacitor 442 is charged to a voltage "$V_{dd\_cap}$" that is equal to $V_{dd}$ minus $V_{diode}$, where $V_{diode}$ is the voltage drop across the diode-connected NMOS transistor 440. The transistors 444 and 446 are long channel devices that discharge the voltage $V_{dd\_cap}$ during transition and reduce the dynamic current. The transistor 450 is controlled by the voltage at a feedback node $N_5$, which is between the inverters 452, 454, to eliminate the leakage current caused by the transistor 448. The voltage $V_{dd\_cap}$ serves as a local power supply for the inverter circuit 432 that is formed by transistors 444-450. When the power supply voltage $V_{dd}$ is higher than the voltage $V_{dd\_cap}$, the inverter circuit 432 generates a low output at the node "$N_6$," which is at the output terminal of the inverter 454. Once the power supply voltage $V_{dd}$ dips below the voltage $V_{dd\_cap}$ by a threshold voltage that is set for fast ramp rates, the inverter circuit 432 generates a high output at the node $N_6$ and discharges the voltage at the node N1 via the transistor 460 to hold the status even though the current bias 468 is removed and the power supply voltage $V_{dd}$ goes down to zero.

Although specific embodiments of the invention that have been described or depicted include several components described or depicted herein, other embodiments of the invention may include fewer or more components to implement less or more feature.

In addition, although specific embodiments of the invention have been described and depicted, the invention is not to be limited to the specific forms or arrangements of parts so described and depicted. The scope of the invention is to be defined by the claims appended hereto and their equivalents.

What is claimed is:

1. A power-on and brown-out detector for a power supply comprising:
   a power-on detection module connected to the power supply and configured to generate a power-on signal in response to a voltage increase of the power supply;
   a brown-out detection module connected to the power supply and configured to generate a brown-out signal in response to a voltage charge by the power supply and a subsequent voltage decrease of the power supply;
   a logic module configured to generate a control signal in response to the power-on signal and the brown-out signal, wherein the power-on detection module is further configured to be activated or deactivated by the control signal; and
   wherein the power-on detection module includes:
      a switch connected to the power supply,
      a voltage divider connected to the switch and configured to generate a divided output voltage, and
      a trigger circuit configured to generate the power-on signal in response to the divided output voltage,
   wherein the brown-out detection module includes:
      a charger circuit connected to the power supply and configured to be charged to a charged voltage by the power supply,
      an inverter circuit connected to the charger circuit and configured to generate an inverted output voltage in response to the charged voltage, and
      a voltage comparator configured to generate the brown-out signal in response to the inverted output voltage, and
   wherein the switch is configured to be turned on or off by the control signal.

2. The power-on and brown-out detector of claim 1, wherein the voltage divider is further configured to generate the divided output voltage if the switch is turned on.

3. The power-on and brown-out detector of claim 1, wherein the voltage divider includes a first resistor and a second resistor, wherein the first resistor is connected to the switch and the trigger circuit, and wherein the second resistor is connected to the trigger circuit and a voltage terminal that is at a fixed voltage.

4. The power-on and brown-out detector of claim 1, wherein the switch includes a transistor, and wherein the control signal is input into a gate terminal of the transistor.

5. The power-on and brown-out detector of claim 1, wherein the trigger circuit is further configured to generate the power-on signal in response to the divided output voltage and a power-on voltage threshold, and wherein the trigger circuit is further configured to generate the power-on signal at a logical high if the divided output voltage is higher than the power-on voltage threshold.

6. The power-on and brown-out detector of claim 1, wherein the trigger circuit includes a Schmitt trigger.

7. The power-on and brown-out detector of claim 1, wherein the logic module includes an RS latch or a JK flip-flop.

8. The power-on and brown-out detector of claim 1, wherein the charger circuit includes a diode-connected transistor and a capacitor that are connected in series between the power supply and a voltage terminal that is at a fixed voltage.

9. The power-on and brown-out detector of claim 8, wherein the inverter circuit includes a plurality of transistors that are connected in series between the power supply and the voltage terminal.

10. The power-on and brown-out detector of claim 9, wherein at least one of the diode-connected transistor and the plurality of transistors is a long channel device.

11. The power-on and brown-out detector of claim 9, wherein at least one of the plurality of transistors is a diode-connected transistor.

12. The power-on and brown-out detector of claim 1, wherein the voltage comparator includes a first transistor connected to the power supply and a resistive voltage divider connected to the first transistor and to a voltage terminal that is at a fixed voltage.

13. The power-on and brown-out detector of claim 12, wherein the voltage comparator further includes a discharging path formed by a second transistor and a resistor.

14. A power-on and brown-out detector for a power supply comprising:
   a power-on detection module including:
   a first transistor connected to the power supply,
   a first resistor and a second resistor connected to the first transistor and configured to generate a divided output voltage, and
   a Schmitt trigger configured to generate a power-on signal in response to the divided output voltage and a power-on voltage threshold;
   a brown-out detection module including:
   a diode-connected transistor and a capacitor that are connected in series between the power supply and a voltage terminal that has a fixed voltage,
   a plurality of transistors that are connected in series between the power supply and the voltage terminal and configured to generate an inverted output voltage, and
   a voltage comparator configured to generate a brown-out signal in response to the inverted output voltage and a brown-out voltage threshold, wherein the voltage comparator includes a second transistor connected to the power supply and a resistive voltage divider connected to the second transistor and to the voltage terminal; and
   an RS latch configured to generate a control signal in response to the power-on signal and the brown-out signal, wherein the first transistor is configured to be turned on or off by the control signal.

15. The power-on and brown-out detector of claim 14, wherein the diode-connected transistor and at least one of the plurality of transistors are long channel devices.

16. The power-on and brown-out detector of claim 14, wherein at least one of the plurality of transistors is a diode-connected transistor.

17. A power-on and brown-out detector for a power supply comprising:
   a power-on detection module including:
   a first transistor connected to the power supply,
   a first resistor and a second resistor connected to the first transistor and configured to generate a divided output voltage, and
   a Schmitt trigger configured to generate a power-on signal in response to the divided output voltage and a power-on voltage threshold;
   a brown-out detection module including:
   a diode-connected transistor and a capacitor that are connected in series between the power supply and a voltage terminal of a fixed voltage,
   a plurality of transistors that are connected in series between the power supply and the voltage terminal and configured to generate an inverted output voltage, and
   a voltage comparator configured to generate a brown-out signal in response to the inverted output voltage and a brown-out voltage threshold, wherein the voltage comparator includes a second transistor connected to the power supply, a resistive voltage divider connected to the second transistor and to the voltage terminal, and a discharging path formed by a third transistor and a third resistor; and
   an RS latch configured to generate a control signal in response to the power-on signal and the brown-out signal, wherein the first transistor is configured to be turned on or off by the control signal.

18. The power-on and brown-out detector of claim 17, wherein at least two of the plurality of transistors are long channel devices.

19. The power-on and brown-out detector of claim 17, wherein at least one of the plurality of transistors is a diode-connected transistor.

* * * * *